United States Patent [19]

Hexamer et al.

[11] Patent Number: 4,498,047
[45] Date of Patent: Feb. 5, 1985

[54] INTEGRATED CIRCUIT MOUNTING APPARATUS

[75] Inventors: Donald L. Hexamer; Randy D. Spence, both of Dallas; Johnny Hesselberg, Garland, all of Tex.

[73] Assignee: Custom Automation Designs, Inc., Garland, Tex.

[21] Appl. No.: 444,971

[22] Filed: Nov. 29, 1982

[51] Int. Cl.$^3$ .................... G01R 31/02; H05K 1/02
[52] U.S. Cl. ...................... 324/158 F; 339/17 CF; 339/45 M; 339/75 MP
[58] Field of Search .......... 324/158 F, 158 R, 73 AT; 339/17 CF, 45 M, 69, 70, 71, 72, 73, 174, 75 M, 75 MP, 176 MP

[56] References Cited

U.S. PATENT DOCUMENTS

| | | | |
|---|---|---|---|
| 3,137,276 | 6/1964 | Weisser | 120/42.03 |
| 3,188,598 | 6/1965 | Pferd | 339/17 |
| 3,191,329 | 6/1965 | Shea | 40/334 |
| 3,302,619 | 2/1967 | Schodterer | 120/42.03 |
| 3,402,379 | 9/1968 | Amis, Jr. et al. | 339/45 M |
| 3,573,617 | 4/1971 | Randolph et al. | 324/158 |
| 3,586,451 | 6/1971 | Canton | 401/33 |
| 3,611,250 | 10/1971 | Reed | 339/17 CF |
| 3,701,077 | 10/1972 | Kelly, Jr. | 339/17 CF |
| 3,805,159 | 4/1974 | Richelmann | 324/158 |
| 4,012,097 | 3/1977 | Long et al. | 339/45 M |
| 4,112,363 | 9/1978 | Morrison et al. | 324/158 P |
| 4,190,311 | 2/1980 | Basta | 339/75 MP |
| 4,329,642 | 5/1982 | Luthi et al. | 324/158 F |

Primary Examiner—Ernest F. Karlsen
Attorney, Agent, or Firm—Hubbard, Thurman, Turner & Tucker

[57] ABSTRACT

An apparatus for mounting an integrated circuit for temporary testing or the like. The mounting apparatus includes a stage or platform which is utilized to support an integrated circuit and which is mechanically biased into an upper position. The stage can be urged into a lower position and temporarily restrained in that position. The mounting apparatus includes a plurality of conductive elements disposed adjacent to the stage which are utilized to conductively contact the leads of an integrated circuit while the stage is restrained in the lower position. Upon the completion of testing or utilization the stage may be restored to the upper position, automatically releasing the integrated circuit.

13 Claims, 8 Drawing Figures

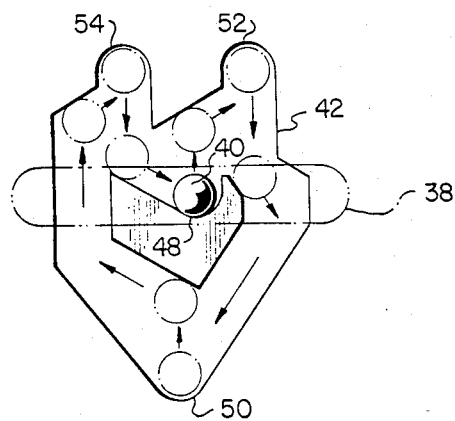
FIG. 4
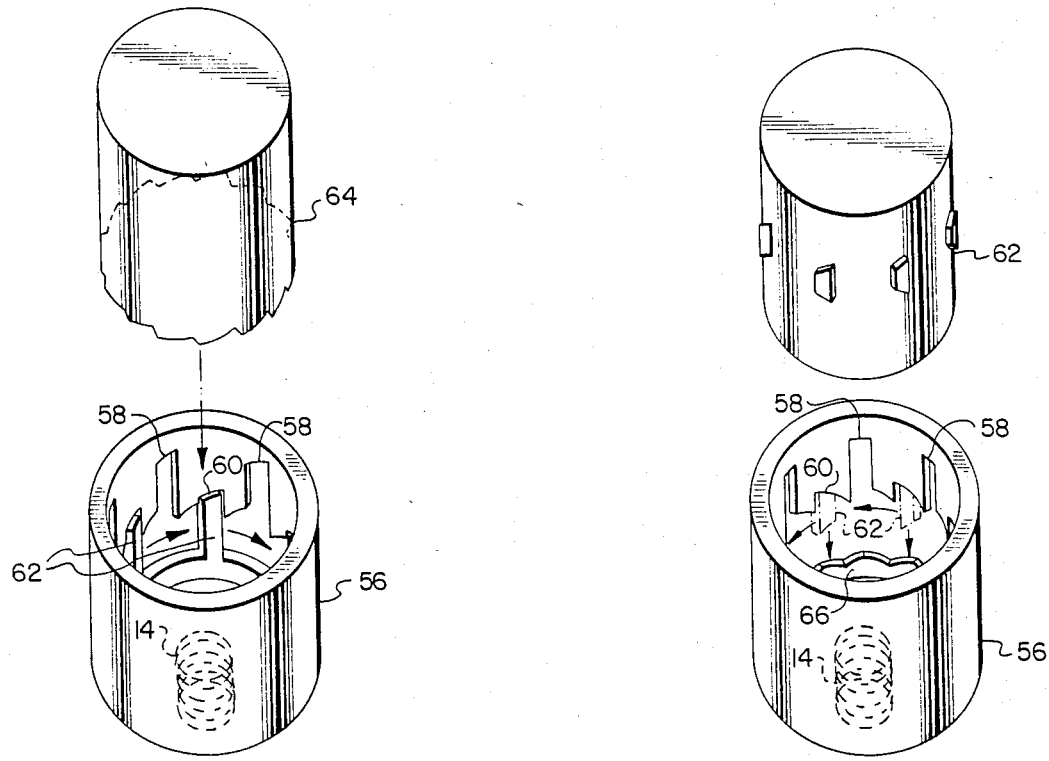
FIG. 5
FIG. 7
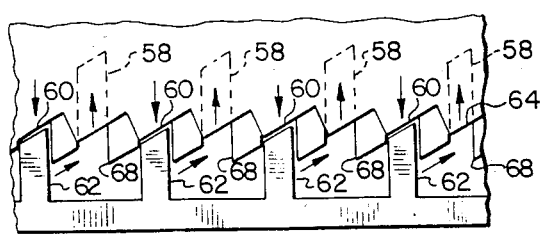
FIG. 6
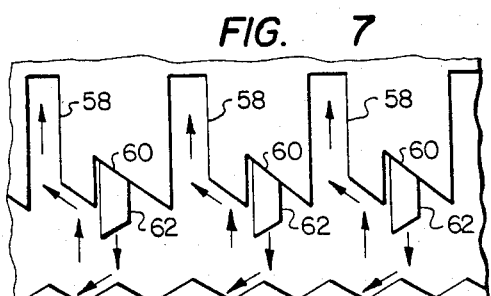
FIG. 8

INTEGRATED CIRCUIT MOUNTING APPARATUS

BACKGROUND OF THE INVENTION

This invention relates in general to apparatus for mounting integrated circuits and in particular to apparatus for mounting integrated circuits which include quick reease mechanisms to facilitate insertion and release of the integrated circuit device.

Integrated circuits are typically mounted on a metallic lead frame and then encased in ceramic or plastic packages. Such packages are usually constructed with metallic leads extending from each of two sides of the package in what is known as a dual in-line package (DIP); however, recently integrated circuits have been constructed with edge connectors instead of conventional leads. Then edge connectors can be disposed along each edge of the package, or along any number of edges.

In operative environments, integrated circuits with metallic leads are generally soldered into place through a printed circuit board, or inserted into a socket which has been mounted to the printed circuit board. The sockets typically utilized include apertures for receiving each lead and friction connectors for retaining each lead in conductive contact with a conductor within the socket. In those applications in which an integrated circuit must be inserted into such a socket and then removed and reinserted elsewhere, as in testing, it is critical for the operator to ensure that the integrated circuit device leads are accurately lined up with the apertures in the socket to prevent bending or breaking of the metallic leads and the resultant malfunction of the device.

The edge connector integrated circuit devices were intended to alleviate the problems associated with socket mounting of integrated circuits; however, it is still necessary to ensure that each of the edge connectors is in conductive contact with the socket to obtain proper operation. Those skilled in the art have appreciated for some time that a great need exists for an improved integrated circuit mounting apparatus that permits simple mounting and reliable releasing of integrated circuit devices.

SUMMARY OF THE INVENTION

It is therefore one object of the present invention to provide an improved integrated circuit mounting apparatus.

It is another object of the present invention to provide an improved integrated circuit mounting apparatus which permits an individual to rapidly insert and remove an integrated circuit device.

It is yet another object of the present invention to provide an improved integrated circuit mounting apparatus which permits rapid insertion and removal of an integrated circuit device without damage to the device or the metallic leads associated with the device.

It is another object of the present invention to provide an improved integrated circuit mounting apparatus which may be simply and inexpensively constructed.

The foregoing objects are achieved as is now described. The mounting apparatus includes a stage or platform which is utilized to support an integrated circuit and which is mechanically biased into an upper position. The stage can be urged into a lower position and temporarily restrained in that position. The mounting apparatus includes a plurality of conductive elements disposed adjacent to the stage which are utilized to conductively contact the leads of an integrated circuit while the stage is restrained in the lower position. Upon the completion of testing or utilization the stage may be restored to the upper position, automatically releasing the integrated circuit.

BRIEF DESCRIPTION OF THE DRAWINGS

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying drawings, wherein:

FIG. 4 depicts an enlarged plan view of the operation of the cam slot of the apparatus of FIG. 3;

FIG. 5 is a partially schematic perspective view of a mounting pedestal utilized in a third embodiment of the novel apparatus of the present invention;

FIG. 6 is a development of the cam surfaces circumferentially disposed within the mounting pedestal of FIG. 5;

FIG. 7 is a partially schematic perspective view of an alternate mounting pedestal utilized in the third embodiment of the novel apparatus of the present invention; and FIG. 8 is a development of the cam surfaces circumferentially disposed within the mounting pedestal of FIG. 7.

DETAILED DESCRIPTION OF THE INVENTION

Figure 1:
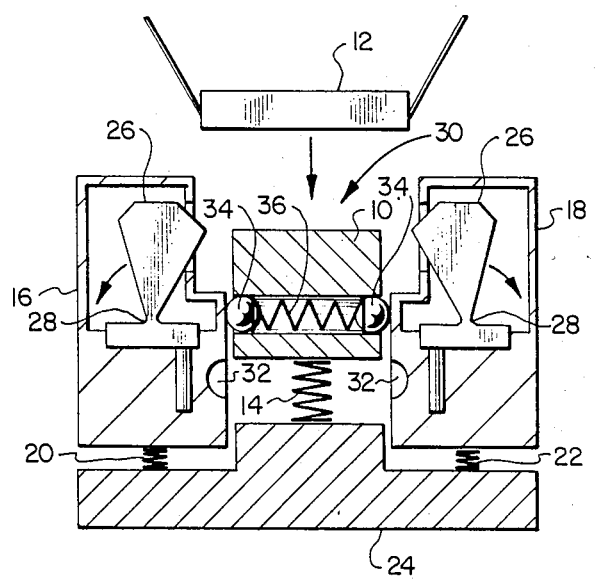
FIG. 1 depicts a sectional side view of one embodiment of the novel integrated circuit mounting apparatus of the present invention prior to insertion of an integrated circuit.

With reference now to FIG. 1, there is depicted a sectional side view of one embodiment of the novel integrated circuit mounting apparatus of the present invention. The mounting apparatus of FIG. 1 includes a movable stage or support platform 10 which is utilized to support an integrated circuit 12. Stage 10 is mechanically biased into the position depicted in FIG. 1 by means of spring 14, although those skilled in the art will appreciate that alternate methods of providing mechanical bias may be utilized.

Figure 2:
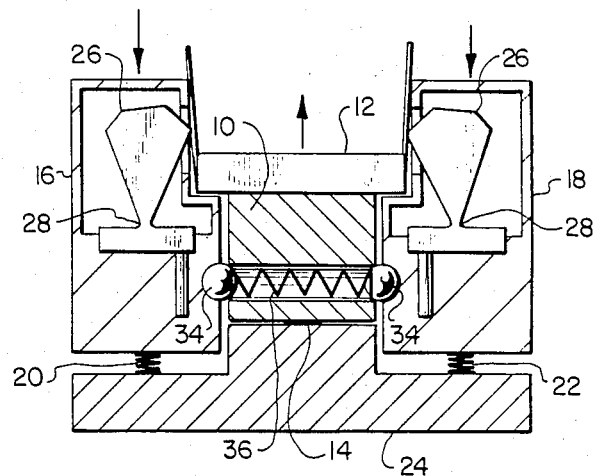
FIG. 2 depicts a sectional side view of the novel integrated circuit mounting apparatus of FIG. 1 after insertion of an integrated circuit.

Stage 10 is preferably mounted within a socket 30 formed by wall sections 16 and 18, and in a preferred embodiment of this invention, the socket is gnerally rectangular in shape and includes two additional wall sections joining wall sections 16 and 18, which are not shown in FIGS. 1 and 2. Wall sections 16 and 18 are flexibly mounted by means of springs 20 and 22 to base section 24.

Disposed within wall sections 16 and 18 are a plurality of conductive knife edge contacts 26 which each include a flexible neck 28 which permits contacts 26 to pivot as indicated in FIG. 1. In this manner, contacts 26 will pivot into wall sections 16 and 18 to permit integrated circuit 12 to enter socket 30, and will pivot out into socket 30 to conductively contact the leads of integrated circuit 12. Additionally, wall sections 16 and 18 each include an aperture 32 adapted to receive spherical members 34 in the manner depicted in FIG. 2. Spherical members 34 are biased into contact with wall sections 16 and 18 by means of spring 36.

Referring now to FIG. 2, the integrated circuit mounting apparatus of FIG. 1 is depicted in the lowered position. As can be seen, as integrated circuit 12 and stage 10 are urged downward, spherical members 34 will engage apertures 32 due to the bias provided by spring 36. As spherical members 34 engage apertures 32, stage 10 is restrained in the lowered position as depicted, enabling contacts 26 to conductively contact the leads of integrated circuit 12. A plurality of electrical conductors (not shown) may be simply connected to contacts 26 to permit integrated circuit 12 to be tested or operated. In order to quickly and easily release integrated circuit 12 from this embodiment of the present invention, wall sections 16 and 18 may be depressed against the bias of springs 20 and 22, causing apertures 32 to move downward below the lowest possible point attainable by spherical members 34. Spherical members 34 are then urged out of apparatus 32 and back into stage 10, against the bias of spring 36, allowing stage 10 to move upward under the bias of spring 14, releasing integrated circuit 12.

Figure 3:
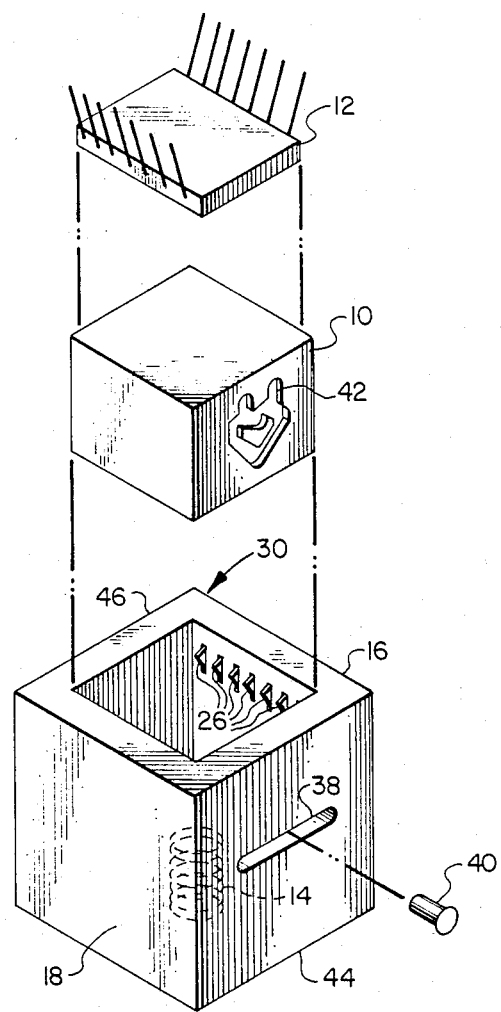
FIG. 3 depicts an exploded perspective view of a second embodiment of the novel integrated circuit mounting apparatus of the present invention.

Referring now to FIG. 3, there is depicted an exploded perspective view of a second embodiment of the novel integrated circuit mounting apparatus of the present invention. Where possible, reference numerals utilized in FIGS. 1 and 2 have been utilized in FIG. 3 for corresponding elements. As can be seen in FIG. 3, socket 30 is generally rectangular in form and is formed of four wall sections including wall sections 16 and 18. Contacts 26 are pivotally mounted as in FIGS. 1 and 2 and extend into socket 30 in order to contact the leads of integrated circuit 12. Stage 10 is mounted within socket 30 and biased toward the upward position by means of spring 14, as in the first embodiment of the present invention.

In this second embodiment of the present invention, cam slot 42 is disposed in at least one side of stage 10 and is utilized to engage pivot and baring pin 40 which is slidably mounted in slot 38 of wall section 44. The cooperative action of cam slot 42 and pivot and bearing pin 40 serve to restrain stage 10 in the lowered and raised positions in a manner which will best be understood upon reference to FIG. 4. As in previous embodiments of the present invention, stage 10, with integrated circuit 12 disposed thereon, when restrained in the lowered position will permit contacts 26 to conductively contact the leads of integrated circuit 12.

With reference now to FIG. 4, there is depicted an enlarged plan view of the operation of cam slot 42 of the apparatus of FIG. 3. Cam slot 42 comprises a depressed section of one side of stage 10 which may be formed during the manufacture of stage 10, by means of injection molding or any other known process for manufacturing such articles. Cam slot 42 engages pivot and bearing pin 40 and includes a first detent 48 and a second detent 50 which correspond to the lowered and raised positions of stage 10 respectively. Those skilled in the art, upon reference to the shape of cam slot 42 will appreciate that when stage 10 is urged downward, pivot and bearing pin 40 will be urged upward in cam slot 42 and will follow the periphery of cam slot 42 to secondary detent 52. In like manner, as stage 10 is released, the bias provided by spring 14 will urge stage 10 and cam slot 42 upward, causing pivot and bearing pin 40 to follow the path outlined in FIG. 4 and be urged toward detent 50. While pivot and bearing pin 40 is disposed in detent 50, stage 10 is disposed in its raised position, maintained in this position by the bias of spring 14.

The next cycle of pivot and bearing pin 40 and cam slot 42 occurs at the next downward urging of stage 10, causing pivot and bearing pin 40 to raise within cam slot 42, following the contours of cam slot 42 to secondary detent 54. Those skilled in the art will again appreciate that upon the release of stage 10, pivot and bearing pin 40 will return to detent 48, thus restraining stage 10 in the lowered position within socket 30. In this manner, it should be apparent that each successive downward urging of stage 10 will cause stage 10 to alternate between its raised and lowered position. This simple operation should greatly enhance the reliability and rapidity with which an operator can insert and remove an integrated circuit device.

With reference now to FIGS. 5, 6, 7 and 8, there are depicted two versions of a third embodiment of the present invention and development views of the cam surfaces disposed circumferentially within each version.

Referring now to FIG. 5, there is depicted a mounting pedestal 56 which serves to mount stage 10 within a socket 30 (not shown) in this embodiment of the present invention. Mounting pedestal 56 includes a plurality of cam slots 58 and 60 circumferentially disposed along its inner surface. Cam slots 58 and cam slots 60 alternate around the circumference of mounting pedestal 56 and also alternate in comparative length, cam slots 58 being longer than cam slots 60. A rotatable cam element 62 is also disposed within mounting pedestal 56 and is biased upward by means of spring 14. Cam element 62 is also designed to engage alternate ones of the cam slots provided. In this manner, cam element 62 will engage either cam slots 58 or cam slots 60. Those skilled in the art will appreciate that upon engaging cam slots 58, cam element 62 will be urged upward by spring 14 to a raised position, and that while engaging cam slots 60, cam element 62 will be restrained in a lowered position against the bias of spring 14 by the dimensions of cam slots 60. Stage 10 (not shown) is coupled to cam actuator 64 which is designed to fit into mounting pedestal 56 and to engage the raised portions of cam element 62.

The operation of the apparatus of FIG. 5 can best be understood upon reference to the development view depicted in FIG. 6. As can be seen in FIG. 6, cam actuator 64 engages the uppermost portion of cam element 62, and cam element 62 is engaged in cam slots 60. A downward urging of stage 10, which is coupled to or formed by cam actuator 64, will cause cam element 62 to be urged downward. As cam actuator 64 reaches its lowermost position, adjoining the bottommost points 68 of cam slots 58 and 60, the bias provided by spring 14 will urge cam element 62 upward, rotating cam element 62 to the right, as depicted in FIG. 6. It should be apparent that as cam actuator 64 is released, cam element 62 will be urged upward into cam slots 58. Conversely, beginning with cam element 62 engaging cam slots 58, a downward urging of cam actuator 64 in combination with the bias of spring 14, will again urge cam element 62 to the right, permitting cam element 62 to engage cam slots 60 when cam actuator 64 is rleased. In this manner, as in the previous embodiment of the present invention, each downward urging of stage 10 and integrated circuit 12 will cause the integrated circuit mounting apparatus of the present invention to alternate between its raised and lowered position, thus permitting simple engagement and release of the integrated circuit device.

With reference now to FIGS. 7 and 8, an alternate mounting pedestal for this third embodiment of the present invention is depicted. As in FIG. 5, mounting pedestal 56 includes a plurality of cam slots 58 and 60 circumferentially disposed along its inner surface. Again, cam slots 58 and cam slots 60 alternate around the circumference of mounting pedestal 56 and also alternate in comparative length, cam slots 58 again being longer than cam slots 60. A rotatable cam element 62 is disposed within mounting pedestal 56 and in this embodiment of the present invention, is coupled to or formed on stage 10 (not shown). As in FIG. 5, cam element 62 is designed to engage alternate ones of the cam slots provided and is biased upward by the action of spring 14.

The operation of the apparatus of FIG. 7 can best be understood upon reference to the development view depicted in FIG. 8. As can be seen in FIG. 8, a downward urging of stage 10 (not shown) which is coupled to cam element 62, will cause cam element 62 to move downward engaging cam actuator 66. A continued downward urging of cam element 62 will urge cam element 62 to the left, as depicted in FIG. 8, in response to the downward urging and the mating surfaces of cam element 62 and fixed cam actuator 66. As stage 10 (not shown) is released, cam element 62 will respond to the urging of spring 14 and will be urged upward, engaging the bottommost surface of cam slots 58 and 60. The bottommost surfaces of cam slots 58 and 60 will serve to urge cam element 62 to the left, permitting cam element 62 to engage cam slots 58. Similarly, with cam element 62 engaging cam slots 58, a downward urging of stage 10 will cause cam element 62 to engage fixed cam actuator 66 and move to the left, thus permitting cam element 62 to engage cam slot 60 in response to the urging of spring 14 upon the release of stage 10. Again, those skilled in the art will appreciate that in this embodiment of the present invention, successive downward urgings of stage 10 will cause the stage to alternate between a raised and lowered position, thus permitting highly reliable engagement and release of an integrated circuit device.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. An integrated circuit mounting apparatus for utilization in testing integrated circuit devices comprising:
    a stage element movable between a first position and a second position and having an upper surface suitable for supporting an integrated circuit device having a plurality of conductive leads disposed along the periphery thereof;
    biasing means for urging said stage element into said first position;
    restraining means for temporarily restraining said stage element in said second position;
    a plurality of conductive elements disposed adjacent to the periphery of said stage element wherein movement of said stage element into said second position will permit said plurality of said conductive elements to contact said plurality of conductive leads at a point above the upper surface of said stage element and wherein movement of said stage element into said first position will permit said integrated circuit device to be lifted from said upper surface of said stage element; and
    releasing means for selectively releasing said stage element from said second position.

2. The integrated circuit mounting apparatus for utilization in testing integrated circuit devices according to claim 1 wherein said first position is an upper position and said second position is a lower position and wherein said restraining means is effective to restrain said stage element in said lower position in response to said stage element being urged downward.

3. The integrated circuit mounting apparatus for utilization in testing integrated circuit devices according to claim 2 wherein said releasing means is effective to release said stage element from said lower postion in response to said stage element being urged downward.

4. The integrated circuit mounting apparatus for utilization in testing integrated circuit devices according to claim 2 wherein said stage element is coupled to a rotatable cam element, said cam element adapted to engage selected ones of a plurality of circumferentially spaced undulating cam slots whereby each downward urging of said stage element is effective to rotate said cam element.

5. The integrated circuit mounting apparatus for utilization in testing integrated circuit devices according to claim 1 wherein said stage element is mounted within a socket adapted to receive said stage element and wherein said restraining means comprises means for temporarily restricting movement between said stage element and said socket.

6. An integrated circuit mounting apparatus for utilization in testing integrated circuit devices comprising:
    a stage element movable between a raised position and a lowered position and having an upper surface suitable for supporting an integrated circuit device having a plurality of conductive leads disposed along the periphery thereof;
    a socket element including a first aperture for surroundingly engaging said stage element;
    a plurality of electrically conductive elements disposed within said socket element adjacent to said stage element wherein movement of said stage element into said lowered position will permit said plurality of conductive elements to contact said plurality of conductive leads at a point above said upper surface of said stage element and wherein movement of said stage element into said raised position will permit said integrated circuit device to be lifted from said upper surface of said stage element;
    a pedestal element including a plurality of circumferentially spaced alternating long and short cam slots;
    a rotatable cam elements coupled to said stage element and disposed within said pedestal element, said cam element adapted to engage alternate ones of said cam slots; and means for rotating said cam element in response to each downward urging of said stage element.

7. The integrated circuit mounting apparatus for utilization in testing integrated circuit devices according to claim 5 wherein said means for rotating said cam element comprises a second cam element adapted to selectively engage said first cam element.

8. An integrated circuit mounting apparatus comprising:
- a stage element movable between a raised position and a lowered position and adapted to support an integrated circuit device having a plurality of leads;
- a socket element including a first aperture adapted to surroundingly engage said stage element;
- a plurality of electrically conductive elements disposed within said socket element adjacent to said stage element and adapted to conductively contact the leads of an integrated circuit device supported by said stage element while said stage element is in the lowered position;
- biasing means for urging said stage element into the raised position;
- a second aperture disposed within said socket element adjacent to a side of said stage element;
- a protuberance from a side of said stage element adapted to engage said second aperture in response to said stage element being urged downward and effective to restrict movement between said stage element and said socket element while so engaged, whereby said stage element is restrained in the lowered position; and
- means for selectively disengaging said protuberance from said second aperture.

9. The integrated circuit mounting apparatus of claim 8 wherein said biasing means comprises a metallic spring.

10. The integrated circuit mounting apparatus of claim 8 wherein said protuberance comprises a spherical member disposed within a cylindrical aperture in a side of said stage element and a second biasing means for urging said spherical member out of said cylindrical aperture.

11. The integrated circuit mounting apparatus of claim 8 wherein said second biasing means comprises a metallic spring.

12. An integrated circuit mounting apparatus comprising:
- a stage element movable between a raised position and a lowered position and adapted to support an integrated circuit device having a plurality of leads;
- a socket element including a first aperture adapted to surroundingly engage said stage element;
- a plurality of electrically conductive elements disposed within said socket element adjacent to said stage element and adapted to conductively contact the leads of an integrated circuit device supported by said stage element while said stage element is in the lowered position;
- biasing means for urging said stage element into the raised position;
- a pivot and bearing pin slidably mounted in a slotted aperture in at least one side of said socket element; and
- a cam slot disposed in at least one side of said stage element for receiving said pivot and bearing pin; said cam slot adapted to urge said pivot and bearing pin between a first detent and a second detent in response to said stage element being urged downward.

13. The integrated circuit mounting apparatus of claim 12 wherein said slotted aperture is perpendicular to the line of movement of said stage element.

* * * * *